US011658065B2

(12) United States Patent
Cui et al.

(10) Patent No.: US 11,658,065 B2
(45) Date of Patent: May 23, 2023

(54) CHEMICAL MECHANICAL POLISHING SLURRY COMPOSITION, METHOD FOR CHEMICAL MECHANICAL POLISHING AND METHOD FOR FORMING CONNECTING STRUCTURE

(71) Applicant: TAIWAN SEMICONDUCTOR MANUFACTURING COMPANY LTD., Hsinchu (TW)

(72) Inventors: Ji Cui, Bolingbrook, IL (US); Fu-Ming Huang, Changhua (TW); Ting-Kui Chang, New Taipei (TW); Tang-Kuei Chang, Tainan (TW); Chun-Chieh Lin, Hsinchu (TW); Wei-Wei Liang, Hsinchu (TW); Chi-Hsiang Shen, Tainan (TW); Ting-Hsun Chang, Kaohsiung (TW); Li-Chieh Wu, Hsinchu (TW); Hung Yen, Kaohsiung (TW); Chi-Jen Liu, Taipei (TW); Liang-Guang Chen, Hsinchu (TW); Kei-Wei Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 396 days.

(21) Appl. No.: 16/902,203

(22) Filed: Jun. 15, 2020

(65) Prior Publication Data
US 2021/0391208 A1    Dec. 16, 2021

(51) Int. Cl.
*H01L 21/768*    (2006.01)
*C09K 3/14*    (2006.01)
(Continued)

(52) U.S. Cl.
CPC ........... *H01L 21/7684* (2013.01); *C09G 1/02* (2013.01); *C09K 3/1463* (2013.01);
(Continued)

(58) Field of Classification Search
CPC .......... H01L 23/53242; H01L 21/7684; H01L 21/3212; H01L 21/30625; C09G 1/02; C09G 1/04; C09K 3/1463
See application file for complete search history.

(56) References Cited

U.S. PATENT DOCUMENTS

| 6,551,935 B1 * | 4/2003 | Sinha | .......................... C23F 3/04 438/693 |
| 2002/0111024 A1 * | 8/2002 | Small | ....................... C09G 1/02 438/689 |

(Continued)

FOREIGN PATENT DOCUMENTS

| JP | 2015021132 A | * | 2/2015 | ........... C09K 3/1409 |
| WO | WO-02066207 A1 | * | 8/2002 | ........... B24B 53/001 |

*Primary Examiner* — Earl N Taylor
(74) *Attorney, Agent, or Firm* — WPAT Law; Anthony King

(57) ABSTRACT

A method for CMP includes following operations. A metal layer is received. A CMP slurry composition is provided in a CMP apparatus. The CMP slurry composition includes at least a first oxidizer and a second oxidizer different from each other. The first oxidizer is oxidized to form a peroxidant by the second oxidizer. A portion of the metal layer is oxidized to form a first metal oxide by the peroxidant. The first metal oxide is re-oxidized to form a second metal oxide by the second oxidizer.

20 Claims, 7 Drawing Sheets

(51) Int. Cl.
*C09G 1/02* (2006.01)
*H01L 21/321* (2006.01)

(52) U.S. Cl.
CPC ........ *C09K 3/1481* (2013.01); *H01L 21/3212* (2013.01); *H01L 21/76877* (2013.01)

(56) References Cited

U.S. PATENT DOCUMENTS

| | | | |
|---|---|---|---|
| 2003/0052308 A1* | 3/2003 | Hu | C09G 1/02 252/387 |
| 2005/0026443 A1* | 2/2005 | Goo | H01L 21/3125 257/E21.548 |
| 2019/0352537 A1* | 11/2019 | Ono | C09G 1/00 |
| 2021/0002511 A1* | 1/2021 | McDonough | C09G 1/04 |
| 2021/0098266 A1* | 4/2021 | Lee | H01L 23/53242 |
| 2021/0257248 A1* | 8/2021 | Chang | H01L 21/76895 |

\* cited by examiner

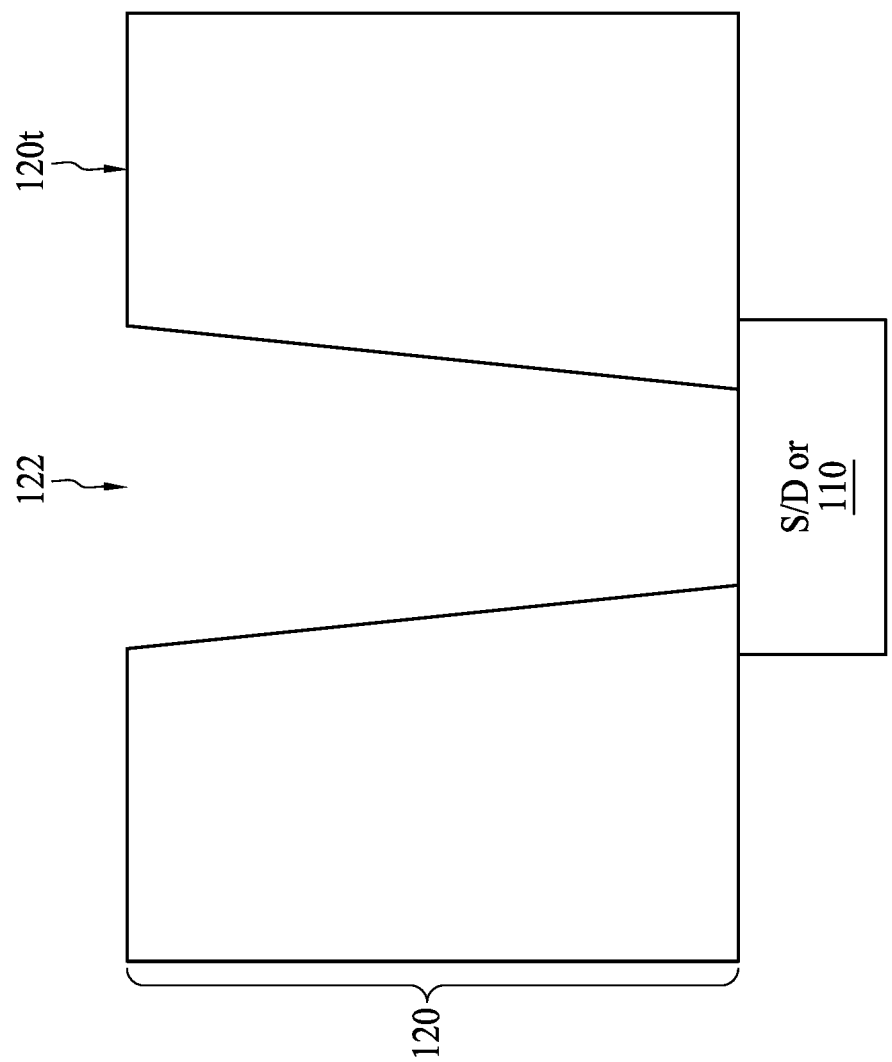

CHEMICAL MECHANICAL POLISHING SLURRY COMPOSITION, METHOD FOR CHEMICAL MECHANICAL POLISHING AND METHOD FOR FORMING CONNECTING STRUCTURE

BACKGROUND

The semiconductor integrated circuit (IC) industry has experienced rapid growth. Technological advances in IC materials and design have produced continuous improvements in generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since the feature sizes continue to decrease, fabrication processes continue to become more difficult to perform. Thus, there is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A to 4D are schematic drawings illustrating various stages in a method for forming a connecting structure according to aspects of one or more embodiments of the present disclosure.

DETAILED DESCRIPTION

Figure 1:
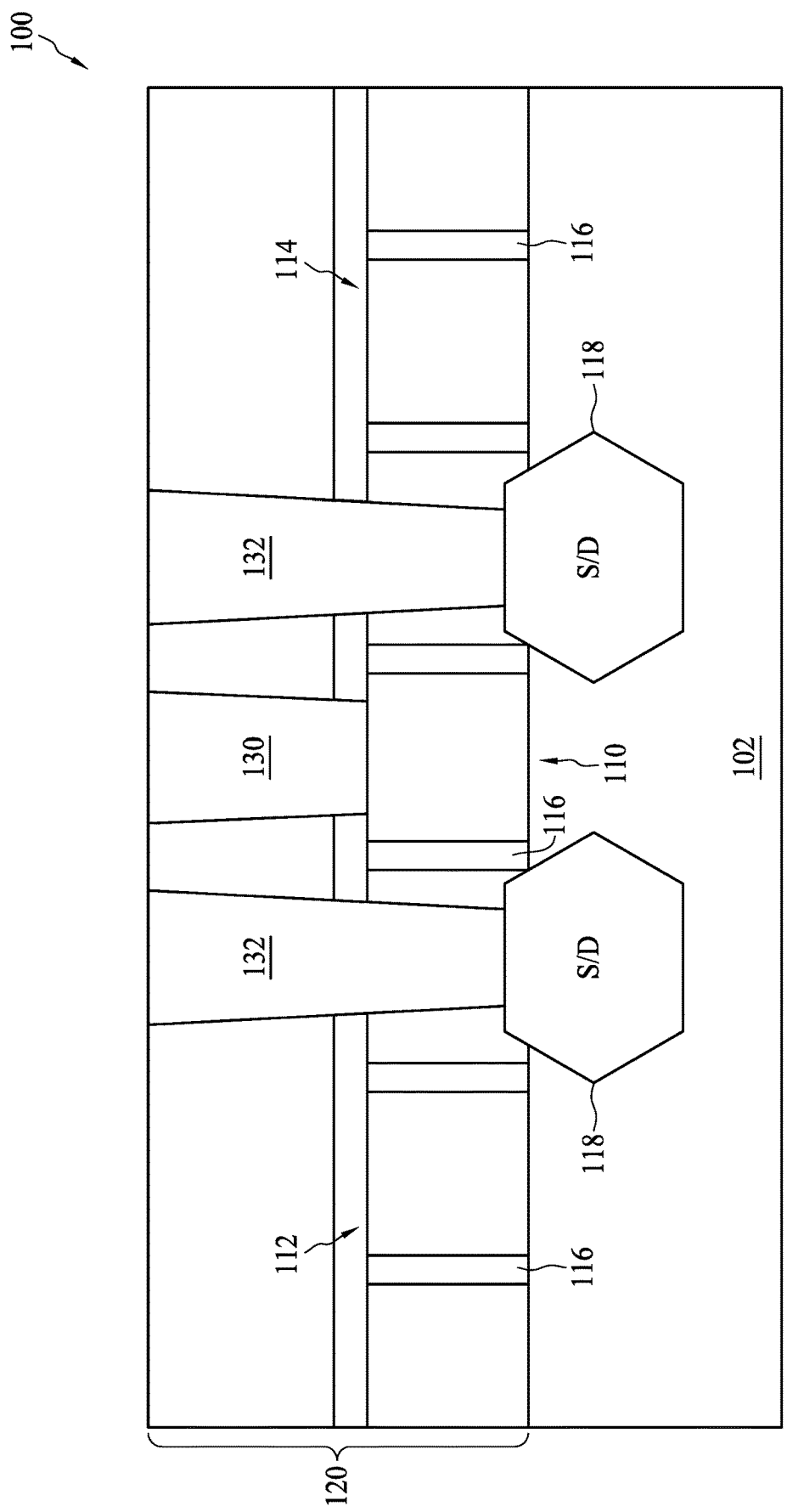
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of multilayer interconnect (MLI) structures that electrically connect the IC devices and the connecting structures fabricated by FEOL and MEOL. Accordingly, operation of the IC devices can be enabled. As mentioned above, the scaling down processes have increased the complexity of processing and manufacturing ICs. For example, in some comparative approaches, ruthenium (Ru) is used to form the connecting structures formed by MEOL, but the Ru-containing connecting structure has presented yield and cost challenges as the connecting structure becomes more compact with ever-shrinking IC feature size.

In some comparative approaches, a via or an opening for forming the connecting structure is formed in a dielectric layer. A CMP operation may be performed to remove superfluous ruthenium such that a surface of the Ru-containing connecting structure and a surface of the dielectric layer may be aligned. In such comparative approaches, hydrogen peroxide ($H_2O_2$)-based slurry is used in the CMP operation for removing the superfluous ruthenium. During the CMP operation, relative movement of the polishing pad and the wafer surface coupled with reactive chemicals in the abrasive slurry allows CMP to remove the superfluous metals by means of both physical and chemical actions. However, it is found that, during the removal of the superfluous metals, noble metals, such as ruthenium, are not easily removed by the $H_2O_2$-based slurry due to their inertness and mechanical hardness.

In other comparative approaches, superfluous ruthenium may be removed by periodate-based slurry. In such approaches, periodate can oxidize ruthenium with an oxidization rate relatively greater than that of hydrogen peroxide;

therefore, the superfluous ruthenium can be removed efficiently. However, the periodate-based slurry suffers from shorter shelf life due to its high oxidization potential and decomposition of the organic component in the slurry. Further, CMP using periodate-based slurry suffers from pad staining. It should be noted that the polishing pad becomes eroded with use, and by-products and debris may be accumulated in the pad's pores and grooves. Thus, pad staining due to the build-up of polishing by-products may occur and thus a surface property of the polishing pad may be changed during the CMP. It is known that pad staining is a major concern because it might cause defect, non-uniformity across the wafer, and removal rate variation during polishing. Further, properties of the pad surface are continuously changing during a process run, which affects the local CMP response and causes numerous process non-uniformity, instability, planarization, and defect issues. Variation in the pad properties during the process run is a significant CMP problem. In addition, variation of the pad properties tends to be uneven, affecting the CMP results.

The present disclosure therefore provides a CMP slurry composition that provides a high removal rate for noble metals with reduced pad-staining issue, a CMP method using the same, and a method for forming a connecting structure using a CMP operation. In some embodiments, the CMP slurry composition includes a dual oxidizer (also referred to as a dual oxidant). In some embodiments, the CMP slurry composition can oxidize the noble metal and thus a first metal oxide is obtained. In some embodiments, the first metal oxide is re-oxidized by a dual oxidizer during the CMP operation and thus a second metal oxide is obtained. In some embodiments, the second metal oxide can be removed more easily than the first metal oxide. Accordingly, the noble metal can be efficiently removed and the pad staining issue can be mitigated. In some embodiments, the method for CMP can be used in a method for forming a connecting structure. In some embodiments, the connecting structure can be a MEOL metallization such as a contact or a plug.

FIG. 1 is a fragmentary cross-sectional view of a semiconductor structure 100, in portion or entirety, according to various aspects of the present disclosure. The semiconductor structure 100 can be included in a microprocessor, a memory, and/or another IC device. In some implementations, the semiconductor structure 100 is a portion of an IC chip, a system on chip (SoC), or a portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, other suitable components, or combinations thereof. The transistors may be planar transistors or multi-gate transistors, such as fin-like FETs (FinFETs). FIG. 1 has been simplified for the sake of clarity to better illustrate the inventive concepts of the present disclosure. Additional features can be added in the semiconductor structure 100, and some of the features described below can be replaced, modified, or eliminated in other embodiments of the semiconductor structure 100.

In some embodiments, the semiconductor structure 100 includes a substrate (wafer) 102. In some embodiment, the substrate 102 includes silicon. Alternatively or additionally, the substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 102 includes one or more group III-V materials, one or more group II-IV materials, or combinations thereof. In some implementations, the substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or combinations thereof. N-type doped regions (for example, n-type wells) include n-type dopants, such as phosphorus, arsenic, another n-type dopant, or combinations thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. An ion implantation process, a diffusion process, and/or another suitable doping process can be performed to form the various doped regions.

Isolations (not shown) can be formed over and/or in the substrate 102 to electrically isolate various regions, such as various device regions, of the semiconductor structure 100. For example, the isolations can define and electrically isolate active device regions and/or passive device regions from each other. The isolations can include silicon oxide, silicon nitride, silicon oxynitride, another suitable isolation material, or combinations thereof. Isolation features can include different structures, such as shallow trench isolation (STI) structures, deep trench isolation (DTI) structures, and/or local oxidation of silicon (LOCOS) structures.

Various gate structures can be disposed over the substrate 102, such as gate structures 110, 112 and 114. In some implementations, one or more of gate structures 110, 112 and 114 can interpose a source region and a drain region, where a channel region is defined between the source region and the drain region. In some embodiments, the gate structures 110, 112 and 114 can are formed over a fin structure. In some embodiments, the gate structures 110, 112 and 114 include a metal gate structure. In some embodiments, the metal gate structure includes a gate dielectric layer and a gate electrode. The gate dielectric layer can be disposed over the substrate 102, and the gate electrode is disposed on the gate dielectric layer. The gate dielectric layer includes a dielectric material, such as silicon oxide, high-k dielectric material, another suitable dielectric material, or combinations thereof. High-k dielectric material generally refers to dielectric materials having a high dielectric constant, for example, greater than a dielectric constant of silicon oxide ($k \approx 3.9$). Exemplary high-k dielectric materials include hafnium, aluminum, zirconium, lanthanum, tantalum, titanium, yttrium, oxygen, nitrogen, another suitable constituent, or combinations thereof. In some embodiments, the gate dielectric layer includes a multilayer structure, such as an interfacial layer (IL) including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, another suitable high-k dielectric material, or combinations thereof.

The gate electrode includes an electrically-conductive material. In some implementations, the gate electrode includes multiple layers, such as one or more work function metal layers and gap-filling metal layers. The work function metal layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, another p-type work function material, or combinations thereof. N-type work function materials include Ti, Al, Ag, Mn, Zr, TiAl, TiAlC, TaC, TaCN, TaSiN, TaAl, TaAlC, TiAlN, another n-type work function material, or combinations thereof. The gap-filling metal layer can include a suitable conductive material, such as Al, W, and/or Cu.

The gate structures 110, 112 and 114 can further include spacers 116, which are disposed adjacent to (for example, along sidewalls of) the gate structures 110, 112 and 114. The spacers 116 can be formed by any suitable process and include a dielectric material. The dielectric material can include silicon, oxygen, carbon, nitrogen, another suitable material, or combinations thereof (for example, silicon oxide, silicon nitride, silicon oxynitride, or silicon carbide). In some embodiments, the spacers 116 can include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structures 110, 112 and 114.

Implantation, diffusion, and/or annealing processes can be performed to form lightly-doped source and drain (LDD) features and/or heavily-doped source and drain (HDD) features in the substrate 102 before and/or after the forming of the spacers 116.

In some embodiments, source/drain regions S/D of the device can include epitaxial structures 118. For example, a semiconductor material is epitaxially grown on the substrate 102, forming epitaxial source/drain structures 118 over a source region and a drain region of the substrate 102. Accordingly, the gate structure 110, the epitaxial source/drain structure 118 and a channel region defined between the epitaxial source/drain structures 118 form a device such as a transistor. In some embodiments, the epitaxial source/drain structures 118 can surround source/drain regions of a fin structure. In some embodiments, the epitaxial source/drain structures 118 can replace portions of the fin structure. The epitaxial source/drain structures 118 are doped with n-type dopants and/or p-type dopants. In some embodiments, where the transistor is configured as an n-type device (for example, having an n-channel), the epitaxial source/drain structure 118 can include silicon-containing epitaxial layers or silicon-carbon-containing epitaxial layers doped with phosphorous, another n-type dopant, or combinations thereof (for example, forming Si:P epitaxial layers or Si:C:P epitaxial layers). In alternative embodiments, where the transistor is configured as a p-type device (for example, having a p-channel), the epitaxial source/drain structures 118 can inculde silicon-and-germanium-containing epitaxial layers doped with boron, another p-type dopant, or combinations thereof (for example, forming Si:Ge:B epitaxial layers). In some embodiments, the epitaxial source/drain structures 180 include materials and/or dopants that achieve desired tensile stress and/or compressive stress in the channel region.

As shown in FIG. 1, one or more interlayer dielectric (ILD) layers 120 can be disposed over the substrate 102. The ILD layer 120 can include a dielectric material including, for example, silicon oxide, silicon nitride, silicon oxynitride, TEOS formed oxide, PSG, BPSG, low-k dielectric material, another suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, another low-k dielectric material, or combinations thereof. As shown in FIG. 1, the ILD layer 120 may cover the source/drain region S/D, the spacers 116 and the gate structures 110, 112 and 114.

In some embodiments, one or more connecting structures 130, 132 can be formed over the source/drain region S/D and the gate structure 110, as shown in FIG. 1. In some embodiments, the connecting structure 130 can be referred to as a metal-to-poly (MP) contact, which generally refers to a contact to a gate structure, such as a poly gate structure or a metal gate structure. The connecting structure 130 is disposed on the gate structure 110, such that the gate structure 130 can be connected to a back-end-of-line (BEOL) interconnection (not shown) through the connecting structure 130. The connecting structure 132 can be referred to as a metal-to-device (MD) or a metal-to-drain (MD) contact, which generally refer to a contact to a conductive region of a transistor, such as the source/drain regions S/D. As shown in FIG. 1, the connecting structures 132 can be disposed on the epitaxial source/drain features 118, respectively, such that the epitaxial source/drain structures 118 can be connected the BEOL interconnection through the connecting structures 132. Accordingly, the FEOL structures can be electrically connected to the BEOL interconnection through the connecting structures 130, 132, which also can be referred to as the MEOL interconnect structures.

Figure 2:
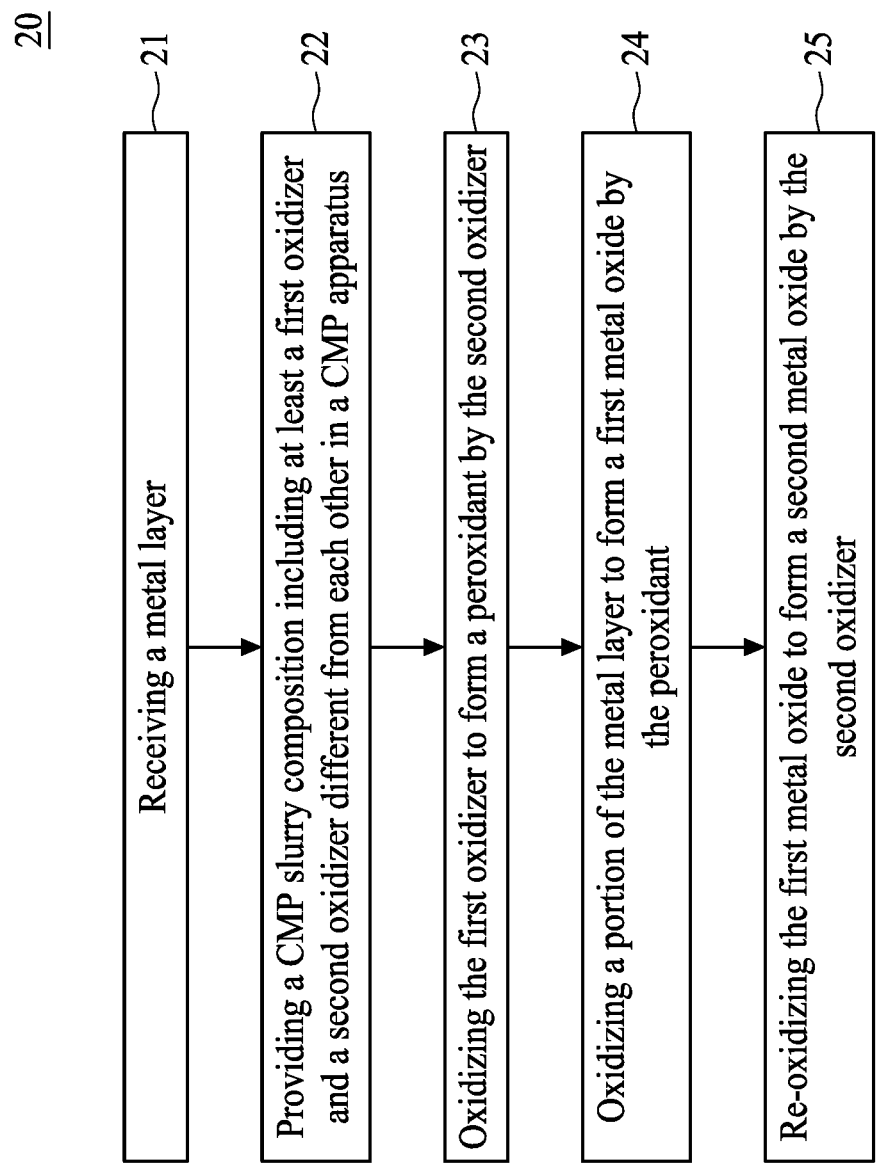
FIG. 2 is a flowchart of a method for CMP according to various aspects of the present disclosure.

FIG. 2 is a flowchart representing a method for CMP 20 according to aspects of the present disclosure. In some embodiments, the method for CMP 20 can be used in a method for forming a connecting structure such as the MEOL interconnect structure mentioned above.

Figure 3:
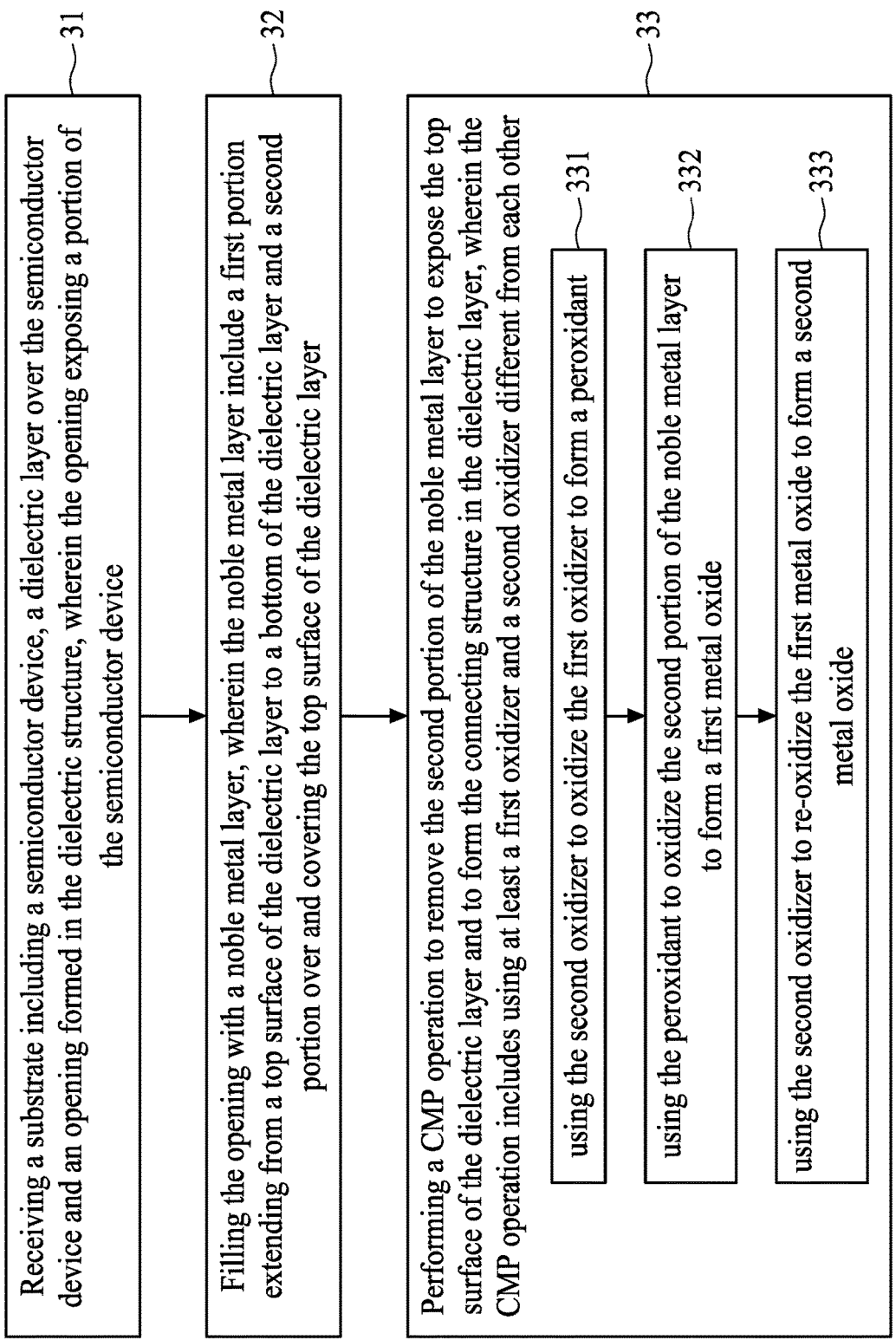
FIG. 3 is a flowchart of a method for forming a connecting structure according to various aspects of the present disclosure.

FIG. 3 is a flowchart representing a method for forming a connecting structure 30 according to aspects of the present disclosure. In some embodiments, the method for forming the connecting structure 30 can be provided to form the connecting structure such as the MEOL interconnect structure mentioned above. In some embodiments, the method for forming the connecting structure 30 can include the method for CMP 20, but the disclosure is not limited thereto.

In some embodiments, the method for CMP 20 includes a number of operations (21, 22, 23, 24 and 25), and the method for forming the connecting structure CMP 30 includes a number of operations (31, 32, 33, 331, 332 and 333). The methods for CMP 20 and the method for forming the connecting structure 30 will be further described according to one or more embodiments. It should be noted that the operations of the methods for CMP 20 and the method for forming the connecting structure 30 may be rearranged or otherwise modified within the scope of the various aspects. It should further be noted that additional processes may be provided before, during, and after the methods 20 and 30, and that some other processes may be only briefly described herein.

Figure 4B:
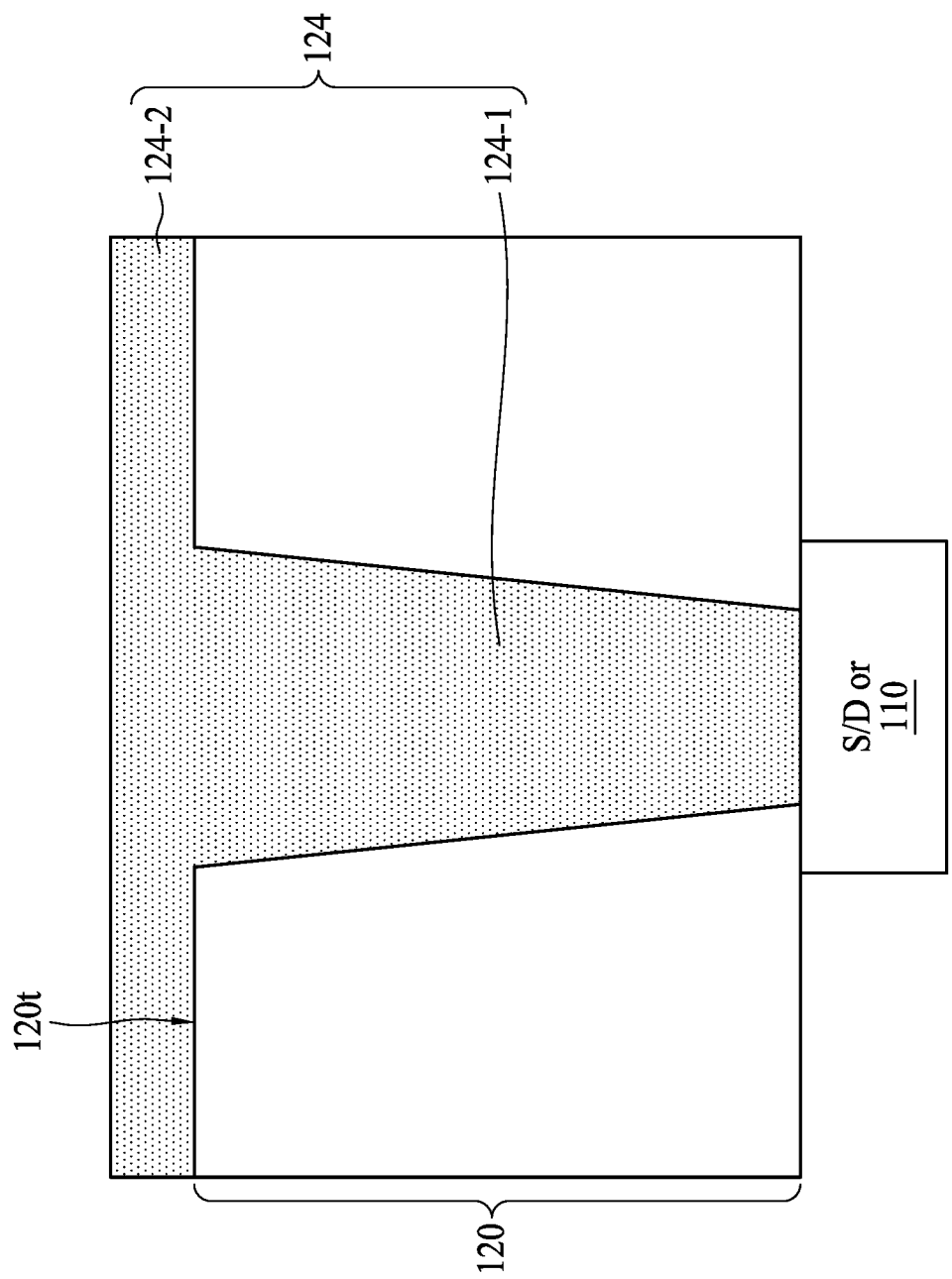

Please refer to FIGS. 4A to 4D, which are schematic drawings illustrating various stages in the method for CMP 20 and in the method for forming the connecting structure 30 according to aspects of one or more embodiments of the present disclosure. For example, in operation 31, a substrate (not shown) is received. The substrate can be the substrate 102 shown in FIG. 1, but the disclosure is not limited thereto. In some embodiments, the substrate can include a semiconductor device, such as the transistor shown in FIG. 1, but the disclosure is not limited thereto. As shown in FIG. 4A, the substrate may include a dielectric layer disposed thereon. In some embodiments, the dielectric layer may include a single layer. In some alternative embodiments, the dielectric layer may include a multi-layered structure that includes a plurality of dielectric layers. In some embodiments, the dielectric layer can be the dielectric layer 120 shown in FIG. 1, but the disclosure is not limited thereto.

Still referring to FIG. 4A, in operation 31, an opening 122 can be formed in the dielectric layer 120. In some embodiments, the opening 122 penetrates the dielectric layer 120 from a top surface 120t to a bottom of the dielectric layer 120. Accordingly, a portion of the semiconductor device is exposed through the opening 122. In some embodiments, the source/drain region S/D or the gate structure 110 of the semiconductor device can be exposed through the opening 122. The opening 122 can be formed by using a typical lithographic operation with masking technologies and anisotropic etch operation (e.g., plasma etching or reactive ion etching), but the disclosure is not limited thereto.

Referring to FIG. 4B, in operation 32, a metal layer 124, such as a noble metal layer, can be formed to fill the opening 122. The noble metal layer can include rhenium (Re), rhodium (Rh) and ruthenium (Ru). In some embodiments, in operation 21, a metal layer 124 formed in a dielectric layer 120 can be received. In some embodiments, the metal layer 124 can include a first portion 124-1 extending from the top surface 120t of the dielectric layer 120 to the bottom of the dielectric layer 120, and a second portion 124-2 over and covering a top surface 120t of the dielectric layer 120. Further, the first portion 124-1 and the second portion 124-2 are coupled to each other. Further, a bottom of the first portion 124-1 is in contact with the exposed portion of the semiconductor structure.

It should be noted that in some embodiments, the metal layer 124 can be formed in an absence of a liner, a barrier, a seed layer or any intervening layer. Therefore in such embodiments, the metal layer 124 can be in contact with the dielectric layer 120, but the disclosure is not limited thereto.

Figure 4C:
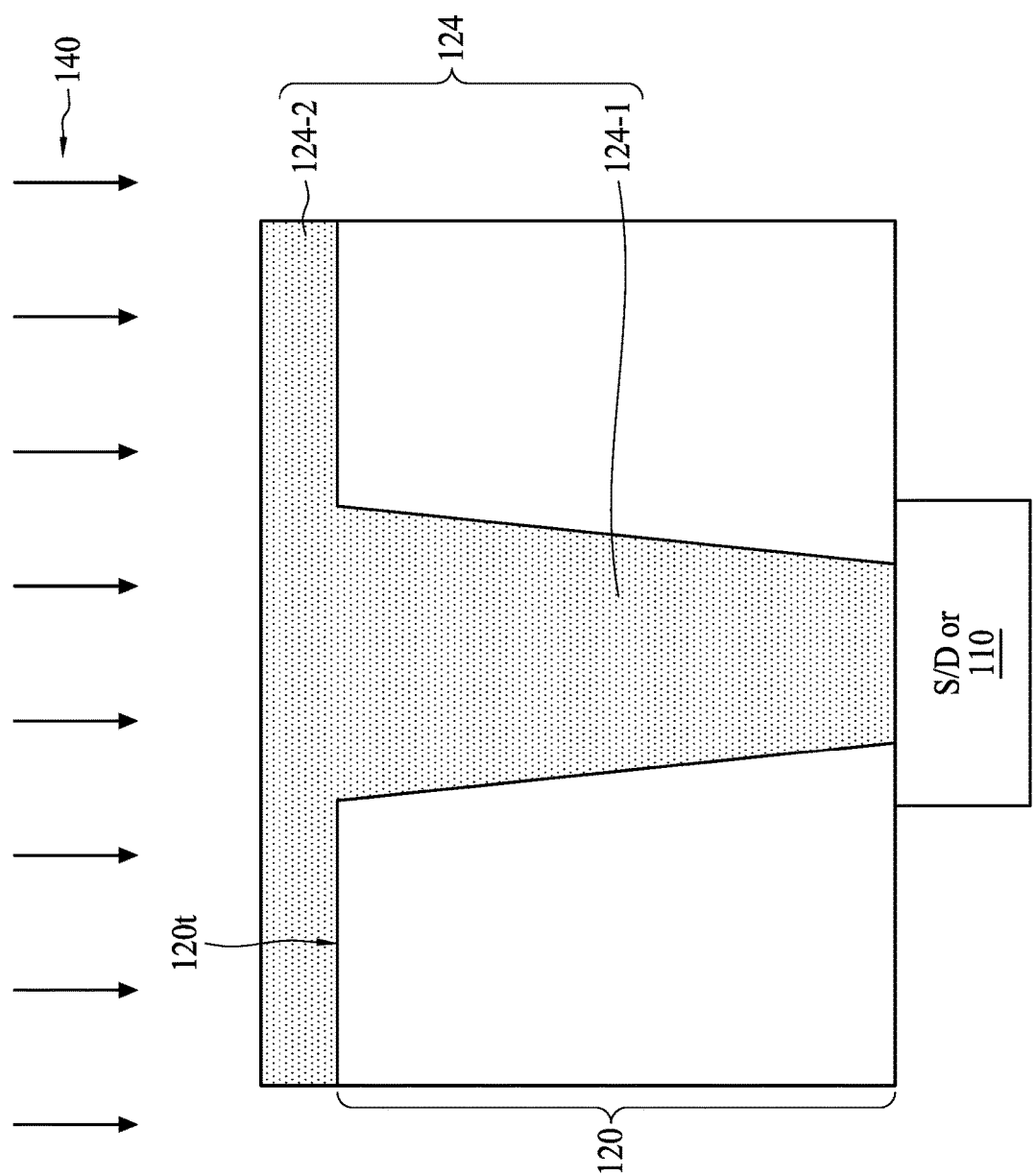

Referring to FIG. 4C, in operation 22, a CMP slurry composition 140 is provided in a CMP apparatus. In operation 33, a CMP operation is performed to remove a portion of the metal layer using the CMP slurry composition 140. In some embodiments, the CMP operation is performed to remove a portion of the metal layer 124 from the top surface 120t of the dielectric layer 120. In some embodiments, the second portion 124-2 of the metal layer 124 is removed from the top surface 120t of the dielectric layer 120 by the CMP operation. In some embodiments, the CMP slurry composition 140 can be dispensed onto a polishing surface of a polishing pad by a slurry dispenser of the CMP apparatus.

The CMP slurry composition 140 can include a first oxidizer, a second oxidizer different from the first oxidizer, one or more abrasive particles and water. In some embodiments, the first oxidizer includes halogen and oxygen. In some embodiments, the first oxidizer can include a halogen oxyacid or its salt. In some embodiments, the halogen oxyacid or its salt includes potassium iodate ($KIO_3$), potassium bromate ($KBrO_3$), and potassium chlorate ($KClO_3$), but the disclosure is not limited thereto. In some embodiments, a concentration of the first oxidizer in the CMP slurry composition 140 is between approximately 0.2% and approximately 5%, but the disclosure is not limited thereto. The second oxidizer can include aqueous ozone ($O_3$). In some embodiments, an ozone concentration of the aqueous ozone is between approximately 200 parts per million (ppm) and approximately 7000 ppm, but the disclosure is not limited thereto. In some embodiments, the second oxidizer is configured to oxidize the halogen oxyacid or its salt. In some embodiments, the halogen oxyacid or its salt before the oxidization includes a first oxidation state, while the halogen oxyacid or its salt after the oxidization includes a second oxidation state, and the second oxidation state is greater than the first oxidation state. The halogen oxyacid or its salt with the greater oxidation state can be configured to oxidize a metal and form a metal oxide. Further, the second oxidizer is configured to re-oxidize the metal oxide. For example, the second oxidizer is ozone, which can oxidize iodate (a halogen oxyacid salt with the first oxidation state) into periodate (a halogen oxyacid salt with the second oxidation state greater than the first oxidation state).

In some embodiments, a pH of the CMP slurry composition 140 is between approximately 2 and approximately 12.0, but the disclosure is not limited thereto. In some embodiments, the pH of the CMP slurry composition 140 is between approximately 7 and approximately 12.0, but the disclosure is not limited thereto. In some embodiments, the abrasive particles can include colloidal silica, fumed silica, aluminum oxide, or a silica shell-based composite submicron particle, but the disclosure is not limited thereto. In some embodiments, a diameter of the abrasive particles can be approximately 70 nanometers, but the disclosure is not limited thereto. In some embodiments, a concentration of the abrasive particles in the CMP slurry composition 140 can be between approximately 0.05% and approximately 15%, but the disclosure is not limited thereto.

In some embodiments, the CMP slurry composition 140 further includes a metal chelator. In some embodiments, the metal chelator can include tartaric acid. In such embodiments, a concentration of the metal chelator can be between approximately 0.05% and approximately 5.0%, but the disclosure is not limited thereto.

In some embodiments, for example but not limited thereto, the first oxidizer in the CMP slurry composition 140 is potassium iodate ($KIO_3$) and the second oxidizer is aqueous ozone ($O_3$). Therefore, it can be inferred that the CMP slurry composition 140 includes dual oxidizer. Potassium iodate is known to be stable at temperatures below 200° C. without a reducing agent, and will not decompose until the temperature reaches 500° C. Compared to a CMP slurry composition including potassium periodate ($KIO_4$), a shelf life of the CMP slurry composition 140 including potassium iodate is longer.

As mentioned above, the CMP operation is performed to remove the superfluous metals by means of both physical and chemical actions. During the chemical actions, the second oxidizer oxidizes the first oxidizer to form a peroxidant, as shown in operation 23 and in operation 331. For example, potassium iodate is oxidized by ozone, and thus potassium periodate is obtained. Peroxidant, in the embodiment, may refer to the halogen oxyacid or its salt.

Potassium periodate is an efficient oxidizer for oxidizing metal, such as ruthenium. Thus, the peroxidant is used to oxidize the metal layer 142 to form a first metal oxide, as in operation 24 and operation 332. For example, potassium periodate is used to oxidize the noble metal, such as ruthenium, and thus ruthenium dioxide ($RuO_2$) is obtained.

Ruthenium dioxide, as a black solid chemical, is found to be a cause of CMP pad staining. As mentioned above, pad staining may cause non-uniformity across the wafer and removal rate (RR) variation during polishing. In some comparative approaches, when the CMP slurry composition is the $KIO_4$-based slurry, the pad staining issue is a major concern.

In some embodiments, the second oxidizer is used to re-oxidize the first metal oxide in operation 25 and in operation 333, and thus a second metal oxide is obtained. For example, ozone is used to re-oxide ruthenium dioxide, and thus ruthenium tetroxide ($RuO_4$) is obtained. Ruthenium tetroxide is a yellow volatile solid that melts near room temperature. Accordingly, ruthenium tetroxide can be easily removed due to its volatile characteristics. Therefore, the pad staining issue is mitigated. In some embodiments, alkaline pH (pH>7.0) is used for the oxidation reaction. For example, the $RuO_4$ exist in a soluble form of anion of $HRuO_5$ to achieve less toxic.

It should be noted that during the chemical reactions in the CMP operation, the first metal oxide (i.e., ruthenium dioxide) is referred to as an intermediate product while the second metal oxide (i.e., ruthenium tetroxide) is referred to as a final product. In a first chemical reaction, the second oxidizer helps to oxidize the first oxidizer to form the peroxidant (such as periodate). In a second chemical reaction, the peroxidant oxidizes the metal to form a first metal oxide, which is the intermediate product. In a third chemical reaction, the second oxidizer re-oxidizes the first metal oxide to form the second metal oxide, which is the final product. It is found that the ruthenium removal rate in the CMP operation using the CMP slurry composition 140 is greater than approximately 400 Å/min. Further, surface uniformity can be improved because the final product mitigates the pad staining issue.

Figure 4D:
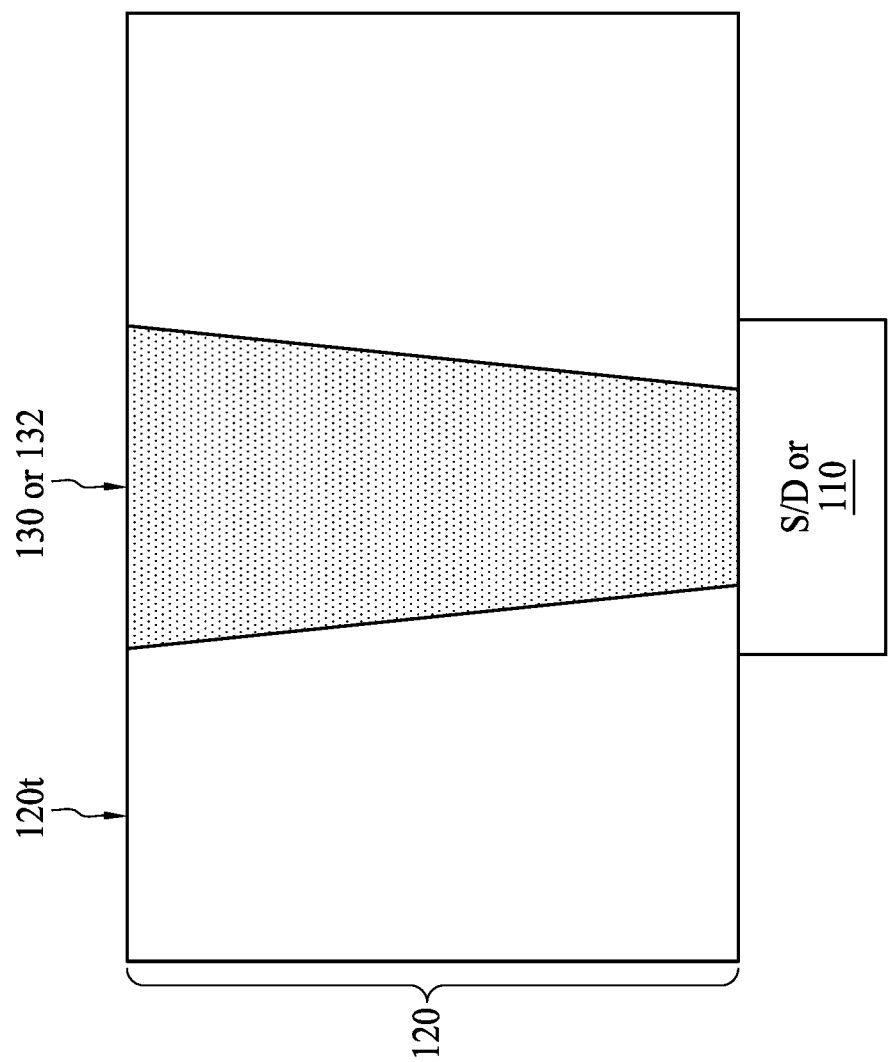

Referring to FIG. 4D, in operation 33, a portion (i.e., the second portion 124-2) of the metal layer 124 is removed and thus the top surface 120t of the dielectric layer 120 is exposed. Accordingly, a connecting structure is obtained, as shown in FIG. 4D. In some embodiments, the connecting structure can be the metal-to-poly connecting structure 130 as shown in FIG. 1. In other embodiments, the connecting structure can be the metal-to-drain connecting structure 132, as shown in FIG. 1. In some embodiments, a top surface of the connecting structure 130, 132 is aligned with the top surface 120t of the dielectric layer 120. Further, a bottom of the connecting structure 130, 132 is in contact with the semiconductor device, such as the source/drain region S/D or the gate structure 110.

In some embodiments, another connecting structure such as a via can be formed on the connecting structure 130, 132. In some embodiments, the via can be formed by the method for forming the connecting structure 20, but the disclosure is not limited thereto.

In some embodiments, after the forming of the connecting structure 130, 132, or after the forming of the via on the connecting structure, a BEOL interconnect fabrication operations can be performed to obtain an integrated circuit (IC) structure.

In summary, the present disclosure provides a CMP composition slurry that provides a high removal rate for noble metals with less pad-staining issue, and a method for CMP using the same. In some embodiments, the CMP slurry composition includes a dual oxidizer. In some embodiments, the CMP slurry composition is used to oxidize the noble metal and thus a first metal oxide is obtained. In some embodiments, the first metal oxide is re-oxidized by dual oxidizer during the CMP operation and thus a second metal oxide is obtained. In some embodiments, the second metal oxide can be removed more easily than the first metal oxide. Accordingly, the noble metal can be efficiently removed and the pad-staining issue can be mitigated. In some embodiments, the CMP method can be used in a method for forming a connecting structure. In some embodiments, the connecting structure can be a MEOL metallization such as a contact or a plug.

In some embodiments, a CMP slurry composition is provided. The CMP slurry composition includes a first oxidizer including a halogen oxyacid or its salt, a second oxidizer including aqueous ozone, and one or more abrasive particles.

In some embodiments, a method for CMP is provided. The method for CMP include following operations. A metal layer is received. A CMP slurry composition is provided in a CMP apparatus. The CMP slurry composition includes at least a first oxidizer and a second oxidizer different from each other. The first oxidizer is oxidized to form a peroxidant by the second oxidizer. A portion of the metal layer is oxidized to form a first metal oxide by the peroxidant. The first metal oxide is re-oxidized to form a second metal oxide by the second oxidizer.

In some embodiments, a method for forming a connecting structure is provided. The method include following operations. A substrate is received. The substrate includes a semiconductor device, a dielectric layer over the semiconductor device and an opening formed in the dielectric layer. In some embodiments, the opening exposes a portion of the semiconductor device. The opening is filled with a noble metal layer. In some embodiments, the noble metal layer includes a first portion extending from a top surface of the dielectric layer to a bottom of the dielectric layer and a second portion over and covering the top surface of the dielectric layer. A CMP operation is performed to remove the second portion of the noble metal layer to expose the top surface of the dielectric layer and to form the connecting structure in the dielectric layer. In some embodiments, the CMP operation includes using at least a first oxidizer and a second oxidizer different from each other. In some embodiments, the CMP operation includes following operations. The second oxidizer is used to oxidize the first oxidizer to form a peroxidant. The peroxidant is used to oxidize the second portion of the noble metal layer to form a first metal oxide. The second oxidizer is used to re-oxidize the first metal oxide to form a second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A chemical-mechanical polishing (CMP) slurry composition, comprising:
   a first oxidizer comprising halogen oxyacid or its salt;
   a second oxidizer comprising aqueous ozone ($O_3$); and
   one or more abrasive particles, wherein an ozone concentration of the aqueous ozone is between approximately 200 parts per million (ppm) and approximately 7000 ppm.

2. The CMP slurry composition of claim 1, wherein the first oxidizer comprises potassium iodate ($KIO_3$), potassium bromate ($KBrO_3$), and potassium chlorate ($KClO_3$).

3. The CMP slurry composition of claim 2, wherein a concentration of the first oxidizer in the CMP slurry composition is between approximately 0.2% and approximately 5.0%.

4. The CMP slurry composition of claim 1, wherein the second oxidizer is configured to oxidize the halogen oxyacid or its salt, the halogen oxyacid before the oxidization includes a first oxidation state, the halogen oxyacid or its salt after the oxidization includes a second oxidation state, and the second oxidation state is greater than the first oxidation state.

5. The CMP slurry composition of claim 1, wherein the second oxidizer is configured to re-oxidize a metal oxide.

6. The CMP slurry composition of claim 5, wherein the metal oxide comprises noble metal oxide.

7. The CMP slurry composition of claim 1, wherein a pH of the CMP slurry composition is between approximately 2.0 and approximately 12.0.

8. The CMP slurry composition of claim 1, wherein the abrasive particles comprise colloidal silica, fumed silica, aluminum oxide, or a silica shell based composite submicron particle.

9. A method for chemical-mechanical polishing (CMP), comprising:
    receiving a metal layer;
    providing a CMP slurry composition in a CMP apparatus, wherein the CMP slurry composition comprises at least a first oxidizer and a second oxidizer different from each other;
    oxidizing the first oxidizer to form a peroxidant by the second oxidizer;
    oxidizing a portion of the metal layer to form a first metal oxide by the peroxidant; and
    re-oxidizing the first metal oxide by the second oxidizer to form a second metal oxide.

10. The method of claim 9, wherein an etching rate of the CMP slurry composition on the metal layer is greater than approximately 400 Å/min.

11. The method of claim 9, wherein the metal layer comprises a noble metal layer.

12. The method of claim 9, wherein the first oxidizer comprises $KIO_3$, $KBrO_3$, and $KClO_3$.

13. The method of claim 12, wherein a concentration of the first oxidizer in the CMP slurry composition is between approximately 0.2% and approximately 5%.

14. The method of claim 9, wherein the second oxidizer comprises aqueous ozone.

15. The method of claim 14, wherein a concentration of the aqueous ozone is between approximately 200 ppm and approximately 7000 ppm.

16. A method for forming a connecting structure, comprising:
    receiving a substrate comprising a semiconductor device, a dielectric layer over the semiconductor device and an opening formed in the dielectric layer, wherein the opening exposes a portion of the semiconductor device;
    filling the opening with a noble metal layer, wherein the noble metal layer comprises a first portion extending from a top surface of the dielectric layer to a bottom of the dielectric layer and a second portion over and covering the top surface of the dielectric layer;
    performing a CMP operation to remove the second portion of the noble metal layer to expose the top surface of the dielectric layer and to form the connecting structure in the dielectric layer, wherein the CMP operation comprises using at least a first oxidizer and a second oxidizer different from each other, and the CMP operation comprises:
        using the second oxidizer to oxidize the first oxidizer to form a peroxidant;
        using the peroxidant to oxidize the second portion of the noble metal layer to form a first metal oxide; and
        using the second oxidizer to re-oxidize the first metal oxide to form a second metal oxide.

17. The method of claim 16, wherein the connecting structure is in contact with the semiconductor device.

18. The method of claim 16, wherein the first oxidizer comprises a halogen oxyacid or its salt.

19. The method of claim 16, wherein the second oxidizer comprises aqueous ozone.

20. The CMP slurry composition of claim 1, wherein a concentration of the abrasive particles in the CMP slurry composition, is between approximately 0.05% and approximately 15%.

* * * * *